(12) United States Patent
Lugil

(10) Patent No.: US 9,083,316 B1
(45) Date of Patent: Jul. 14, 2015

(54) METHOD AND SYSTEM OF FILTERING POLYPHASED DATA

(75) Inventor: Nico Lugil, Rotselaar (BE)

(73) Assignee: Keysight Technologies, Inc., Santa Rosa, CA (US)

(*) Notice: Subject to any disclaimer, the term of this patent is extended or adjusted under 35 U.S.C. 154(b) by 931 days.

(21) Appl. No.: 12/883,224

(22) Filed: Sep. 16, 2010

(51) Int. Cl.
*H03H 17/02* (2006.01)

(52) U.S. Cl.
CPC ....... *H03H 17/0273* (2013.01); *H03H 17/0266* (2013.01)

(58) Field of Classification Search
CPC .................. H03H 17/0266; H03H 17/0273
USPC .......................................... 708/308, 316, 319
See application file for complete search history.

(56) References Cited

U.S. PATENT DOCUMENTS

| | | | | |
|---|---|---|---|---|
| 6,889,238 | B2 * | 5/2005 | Johnson | 708/313 |
| 7,236,110 | B2 * | 6/2007 | Antonesei | 341/61 |
| 2003/0076899 | A1 * | 4/2003 | Kumar et al. | 375/316 |
| 2005/0286619 | A1 * | 12/2005 | Haddadin et al. | 375/222 |
| 2006/0120494 | A1 * | 6/2006 | Bhuvanagiri et al. | 375/350 |
| 2006/0178759 | A1 * | 8/2006 | Koehler | 700/18 |

* cited by examiner

*Primary Examiner* — Chuong D Ngo

(57) ABSTRACT

Polyphased input data is filtered. A number of delay lines are provided corresponding to the number of polyphases. Each delay lines stores a set of input data samples. Filter elements are provided for each delay line. The filter elements operate at a particular time on different subsets of the input data samples stored in the delay line. During a given time interval a number of new input data samples corresponding to the number of filter elements in the group of filter elements are shifted into the delay line. During a plurality of subintervals within the time interval, groups of filter coefficients are supplied to the group of filter elements. In each subinterval, all of the filter elements within the group receive the same set of filter coefficients, and output an output data sample. Output data samples from corresponding filter elements for different delay line are combined to produce filtered data.

16 Claims, 3 Drawing Sheets

METHOD AND SYSTEM OF FILTERING POLYPHASED DATA

BACKGROUND

In some systems and applications, a signal has a very high data rate that makes it impossible or impractical to perform a desired signal processing operation on the signal's data in a serial fashion. In that case, in some applications the signal may be divided into a plurality of lower data rate components in a "round-robin" manner such that some parallel operations may be performed on the data and the processed data may then be recombined if desired into a processed signal. When the signal is divided in this case, the resultant data may be referred to as "polyphased data."

Some signal processing applications require filtering polyphased data with several digital filters each having a different corresponding set of filter coefficients. However, when a large number of digital filters are to be applied to polyphased data at a high data rate, throughput requirements, and in particular filter coefficient throughput requirements, can place a significant strain on system resources.

It would be desirable to provide an efficient approach for filtering polyphased data.

SUMMARY

In an example embodiment, a device is a provided for filtering polyphased input data having a plurality of polyphases. The device comprises: a plurality of delay lines corresponding to the plurality of polyphases, where a delay line is configured to receive a set of the input data samples from the corresponding polyphase; and a plurality of groups of filter elements corresponding to the plurality of delay lines and the plurality of polyphases. The filter elements with any one of the groups are configured to operate in parallel with each other on corresponding different subsets of the set of the input data samples for the corresponding delay line. The filter elements within any one of the groups are configured to sequentially perform a plurality of filtering operations on the corresponding subsets of the set of the input data samples using a plurality of sets of filter coefficients which are sequentially received. The filter elements within any one of the groups are configured to employ a same set of filter coefficients as each other at a same time during the filtering operations. Each filter element provides an output data sample for each filtering operation. A combiner combines the output data samples from the groups of filter elements to produce filtered data. The delay lines have lengths greater than the number of the input data samples in any one of the subsets.

In another example embodiment, a method is provided for filtering polyphased input data having a plurality of polyphases. The method comprises providing a plurality of delay lines corresponding to the plurality of polyphases, the delay lines being configured to store a set of input data samples. The method further comprises, for any one of the delay lines: providing a corresponding group of filter elements, the filter elements being configured to operate at a particular time on corresponding different subsets of the set of the input data samples stored in the corresponding delay line; during a given time interval shifting into the delay line a plurality of new input data samples corresponding to a number of filter elements in the group of filter elements; during a plurality of subintervals within the time interval, sequentially supplying a group of filter coefficients to the group of filter elements, each of the filter elements receiving in each subinterval a same set of filter coefficients as other filter elements within the group; and outputting from each filter element an output data sample. Corresponding output data samples from corresponding filter elements for the plurality of delay lines are combined to produce filtered data.

In yet another embodiment, a method is provided for filtering polyphased input data having a plurality (P) of polyphases. The method comprises providing P delay lines corresponding to the P polyphases, the delay lines being $L=(Y+M-1)$ input data samples long. The method further comprises, for a polyphase: providing Y identical filter elements, wherein a filter element operates with M filter coefficients; and during a time interval: shifting a set of Y new input data samples for the polyphase into the corresponding delay line such that the corresponding delay line has L input data samples, and for a subinterval among a plurality (Z) of subintervals within the time interval, updating the Y identical filter elements with a new set of filter coefficients from among a plurality (Z) of sets of filter coefficients, filtering Y different subsets of the L input data samples in the corresponding delay line with the Y filter elements having identical filter coefficients to produce Y output data samples, and combining the Y output data samples for the polyphase with corresponding output data samples from all of the other polyphases to produce filtered data.

BRIEF DESCRIPTION OF THE DRAWINGS

The example embodiments are best understood from the following detailed description when read with the accompanying drawing figures. In fact, the dimensions may be arbitrarily increased or decreased for clarity of discussion. Wherever applicable and practical, like reference numerals refer to like elements.

DETAILED DESCRIPTION

Figure 1:
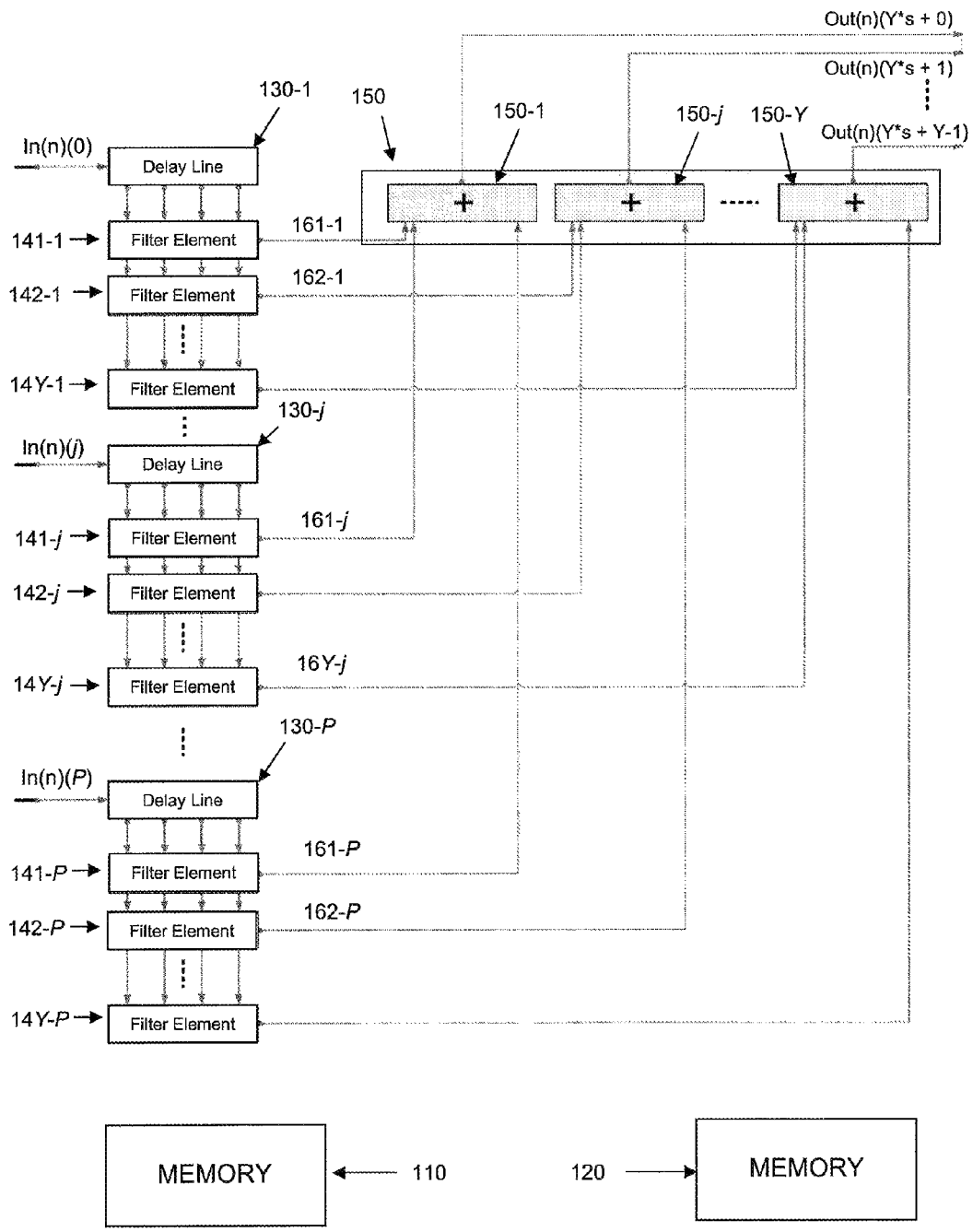
FIG. 1 illustrates one embodiment of a device for filtering polyphased data.

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

As used herein a "collection of polyphased input data samples" refers to all of the polyphased input data samples of a polyphased input signal that are to be filtered. A collection of polyphased input data includes a plurality of input data samples for a plurality of time indices of interest for a plurality of polyphases. Each input data sample may be denoted as IN(time index)(Polyphase index)=IN(n)(j), where n is a time index for the input data and j is a polyphase index.

As used herein a "group of polyphased input data samples" refers to input data samples from the collection of polyphased input data samples that have a same time index, n, e.g., {IN(n)(1)~IN(n)(P)}, where the number of polyphases is P.

As used herein a "set of input data samples" refers to input data samples for one polyphase that are operated upon at a given time, e.g., {IN(n−(r−1))(j)~IN(n)(j)}, where the set of input data belongs to polyphase j, and r equals the number of input data samples in the set.

As used herein, a "filtering operation" refers to an operation performed on a set of input data samples as part of an overall process of filtering an entire collection of polyphased input data samples.

As used herein, a "filter element" refers to a component which performs a filtering operation on a set of input data samples, for example a multiply-and-accumulate (MAC) unit.

As used herein, a "group of filter elements" refers to all of the filter elements employed for one polyphase.

As used herein, a "collection of filter elements" refers to all of the filter elements employed for all of the polyphases of a polyphased input signal.

As used herein a "set of filter coefficients" refers to the filter coefficients employed by one filter element at a given time to perform a filtering operation on a set of input data samples In examples described below, a filter element may comprise one MAC unit operating with a set of M=4 filter coefficients to perform a MAC operation on a set of four (4) input data samples at a given time.

As used herein, a "group of filter coefficients" refers to all of the filter coefficients employed by one group of filter elements for one polyphase at a given time. For example, where each polyphase has Y=8 filter elements each employing a different set of M=4 filter coefficients, then a group of filter coefficients has 32 filter coefficients.

As used herein, a "cluster of filter coefficients" refers to all of the filter coefficients employed by the collection of filter elements for all of the polyphases at a given time.

As used herein, a "filter" is a collection of delay lines, filter elements, and combiners that is configured to apply a desired filter function to a collection of input data samples.

Consider a signal represented in polyphased manner with P polyphases, and a filter that requires performing X parallel filtering operations on input data samples for each polyphase of the signal where the system hardware only supports calculation of Y available parallel filtering operations for each polyphase in real time (e.g., there are only Y filter elements available for each polyphase), and X>Y (in practice X often equals P). Since X>Y, it is apparent that the system cannot produce a real time output. It is also assumed that the rate of processing this signal can be controlled, e.g., by a push-pull interface at the source (e.g., the data samples are read out of a memory device or any other source with handshaking to control the data throughput).

One solution is to cycle X/Y groups of filter coefficients over a static set of input data samples for each polyphase. In that case, if we consider that the filter coefficients are updated every clock cycle, then the input data samples are updated only once every X/Y clock cycles.

Alternatively one could pass a set of input data samples from each polyphase over a group of Y filtering elements each having a corresponding first set of filter coefficients to perform a first set of Y parallel filtering operations, then run the same polyphased data samples over the same Y filtering elements this time each having a next set of filter coefficients, etc., until the input data samples for each polyphase are passed through all X filtering operations. However this is often not practical, as it requires the source to be able to "replay" the data record.

A method to be described below could be interpreted as a way of mixing both approaches. As a starting point, a method is described below that cycles the filter coefficients over the data samples. Then it will be explained how this method can be altered to still get the maximum throughput, but with relaxed constraints on the update rate for the filter coefficients.

A method and device are explained by examples below, but can easily be generalized. The examples below employ polyphased data with P=160 polyphases, where for each polyphase: X=160 filtering operations are to be applied to the polyphased data; Y=8 available filter elements can be applied in real time; the filter coefficients have N=16 bits; and there are M=4 filter coefficients per filter element. Therefore, if the filter coefficients are stored in a memory device, then using the exemplary numbers from above, the memory device needs to store C=M*X*P*N=4*160*160*16=1,638,400 bits of filter coefficients.

FIG. 1 illustrates one embodiment of a device 100 for filtering polyphased data. In the example of FIG. 1, the input data samples of each polyphase (e.g., P=160 polyphases) are to be subjected to X=160 filtering operations, each employing a set of M=4 filtering coefficients operating on a set of four input data samples at a time, to realize a 640 tap digital filter.

Device 100 includes a first source 110; a second source 120; a plurality of delay lines 130-1~130-P; a plurality of groups of filter elements 141-1~14Y-1 through 141-P~14Y-P; and a combiner 150 including a plurality of combining elements 150-1~150-Y, where in the illustrated example Y=8 and P=160. Each of the delay lines 130-1~130-P stores a set of four (4) input data samples at any given time, and each of the filter elements 141-1~14Y-1 through 141-P~14Y-P operates on the set of four input data samples with a set of M=4 filter coefficients. In some embodiments, each of the filter elements 141-1~14Y-1 through 141-P~14Y-P comprises a multiply-accumulate (MAC) unit.

In one embodiment, first source 110 comprises a memory device for storing data samples. In alternative embodiments, input data samples may be supplied from any other source which includes an appropriate mechanism (e.g., through handshaking) to control or throttle the data output rate.

In one embodiment, second source 120 comprises a memory device for storing filter coefficients. In alternative embodiments, filter coefficients may be supplied from any other source which includes an appropriate mechanism (e.g., through handshaking) to control or throttle the coefficient output rate.

In operation, polyphased input data samples are supplied from first source 110 to delay lines 130-1~130-P, with one new input data sample IN(n)(j) for each polyphase j being shifted into a corresponding delay line 130-j during a given time interval, q.

Also, sets of filter coefficients are supplied from second source 120 to each of the filter elements 141-1~14Y-1 through 141-P~14Y-P. Because there are only Y=8 physical filter elements 141-*j*~14Y-j available in device 100 for each polyphase j, and in the given example device 100 needs to apply X=160 filtering operations to a set of input data samples {IN(n−3)(j) ~IN(n)(j)} for each polyphase j during each time interval q, device 100 needs to loop X/Y=20 sets of filter coefficients through each of the filter elements 141-1~14Y-1 through 141-P~14Y-P during each time interval q before it can shift a new group of polyphased input data samples {IN(n+1)(1)~IN(n+1)(P)} into delay lines 130-1~130-P. Each time interval q can be considered to be divided into Z=20 subintervals s, wherein each of the Y filter elements 141-*j*~14Y-j for each polyphase j is updated with a new set of filter coefficients from second source 120 during each subinterval s.

During each subinterval, the set of input data samples in each corresponding delay line 130-*j* is processed by the corresponding group of filter elements 141-*j*~14Y-j to produce output data samples 161-*j*~16Y-j. The output data samples 161-*j*~16Y-j from each of the filter elements 141-*j*~14Y-j for polyphase j are combined with corresponding output data samples from all of the other polyphases to produce filtered data signals Out[n][Y*s+0]~Out[n][Y*s+Y−1], where s is an index for the subintervals (0~19), and can be considered to be an index for decimation when device 100 performs filtering and decimation. In particular, the output samples 161-1~161-P from filter elements 141-1~141-P are combined together by combining element 150-1 to produce filtered data signal Out[n][Y*s+0], the output samples 162-1~162-P from filter elements 141-2~142-P are combined together by combining element 150-2 to produce filtered data signal Out[n][Y*s+1], etc. to output Y=8 filtered data signals which can be multiplexed to reconstruct a filtered output signal.

If we consider an example where Y=8, at the eight (8) outputs of device 100, as a function of time, the filtered data is:

| TIME | $1^{st}$ Output | $2^{nd}$ Output | $3^{rd}$ Output | | $8^{th}$ Output |
|---|---|---|---|---|---|
| Subinterval0 | Out[n][0] | Out[n][1] | Out[n][2] | ... | Out[n][7] |
| Subinterval1 | Out[n][8] | Out[n][9] | Out[n][10] | ... | Out[n][15] |
| ... | | | | | |
| Subinterval19 | Out[n][152] | Out[n][153] | Out[n][154] | ... | Out[n][159] |
| Subinterval20 | Out[n + 1][0] | Out[n + 1][1] | Out[n + 1][2] | ... | Out[n + 1][7] |
| Subinterval21 | Out[n + 1][8] | Out[n + 1][9] | Out[n + 1][10] | ... | Out[n + 1][15] |
| ... | | | | | | where n is a time index corresponding to the input data samples.

In some embodiments, device 100 may execute a decimation/downsampling algorithm in conjunction with its filtering function. In that case, each of the filtered data signals may represent a filtered and decimated/downsampled by P version of the polyphased input data in which case for P polyphases in, there is only one data sample out, hence the decimation. When X=P, there is no decimation and the output represents a time variant filter of the input signal with period P=X. In a more general case, device 100 may decimate by some number H, in which case X=P/H.

In some embodiments, device 100 may be employed to create periodic time variant filters with or without decimation.

Now consider a case where second source 120 comprises a memory device, as will be the case in many embodiments.

To filter the polyphased data at the full clock rate using device 100 requires that device 100 be able to read C/20=81920 bits (or M*Y*P*N=81920 bits) of filter coefficients from the memory device for second source 120 for each subinterval or clock cycle. In particular, for the example operation of device 100 described above, a processor (not shown in FIG. 1) may control operations and timing of the circuitry in FIG. 1, including supplying a loop of Z=20 addresses to the memory device for second source 120 over Z=20 subintervals in order to cause the memory device for second source 120 to output a series of 20 clusters of filters coefficients, each cluster of filter coefficients comprising 81920 bits for 1280 sets of filter coefficients (i.e., M=4*16-bit filter coefficients for eight (8) filter elements for each of 160 polyphases). This means that the memory device for second source 120 needs to be at least 81920 bits wide and only 20 bits deep. Here, we refer to "width" as the number of bits that are output from a memory device for a given address and the "depth" of the memory device to be the number of unique locations or addresses in the memory device.

However, in general it is not economical to have very wide but shallow memory devices. In general it would be preferable if the C=1,638,400 bits of filter coefficients were stored into a narrower, deeper, memory device.

Figure 2:
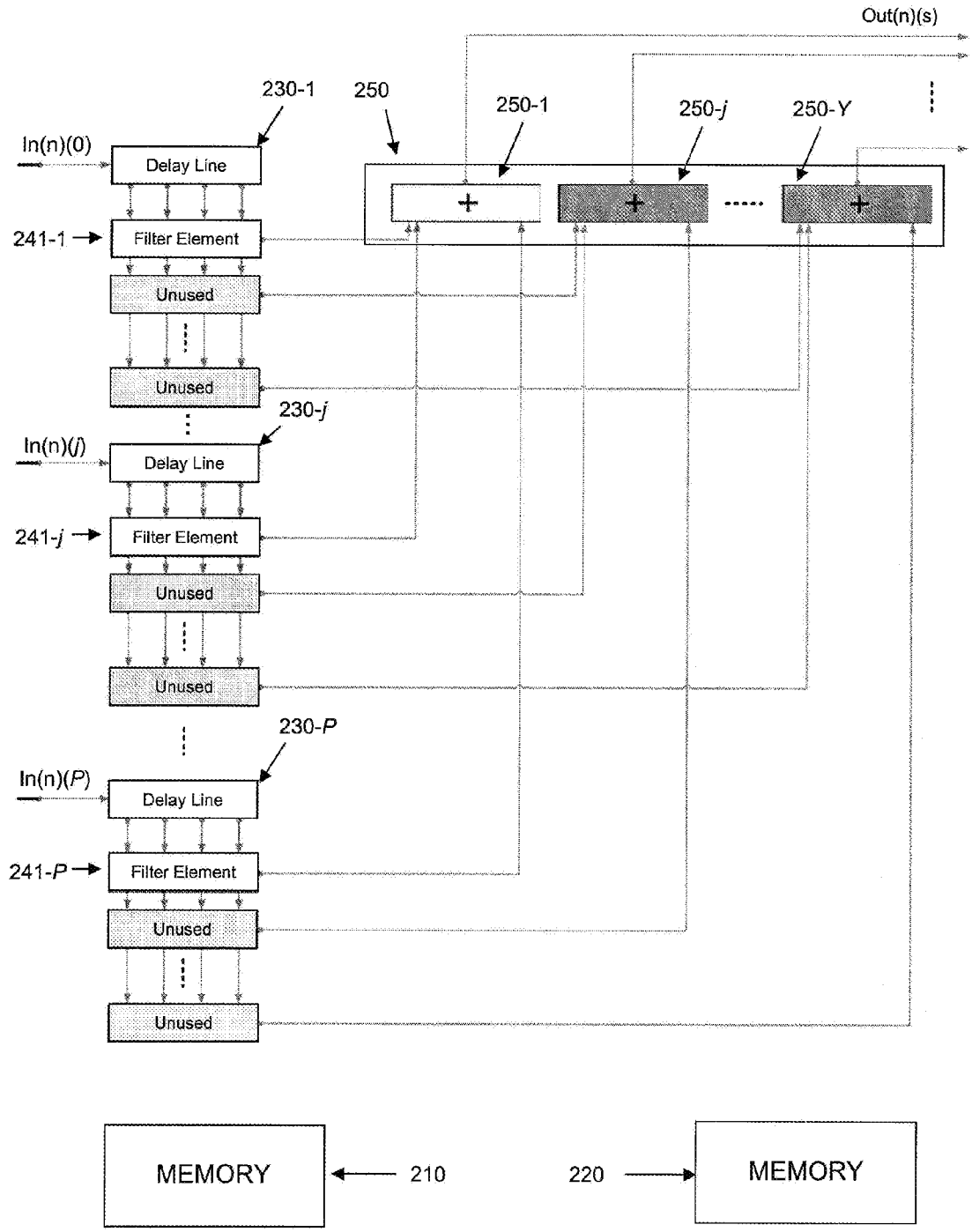
FIG. 2 illustrates another embodiment of a device for filtering polyphased data.

As a second example, if the maximum allowable width of a memory device employed for the source for the coefficients is set to be 10240 bits, then device 100 can be configured as shown in FIG. 2.

FIG. 2 illustrates another embodiment of a device 200 for filtering polyphased data samples.

Device 200 includes a first source 210; a second source 220; a plurality of delay lines 230-1~230-P; a plurality of groups of filter elements 241-1~241-P; and a combiner 250 including a plurality of combining elements 250-1~250-Y, where in the illustrated example P=160. Each of the delay lines 230-1~230-P stores a set of M=4 input data samples at any given time, and each of the filter elements 241-1~241-P operates on the set of M=4 input data samples with M=4 filter coefficients. In some embodiments, each of the filter elements 241-1~241-P comprises a multiply-accumulate (MAC) unit.

The operation of device 200 is similar to that of device 100 as explained above, with the following differences. In device 200, only one filter element is employed for each polyphase, and the other seven filter elements are unused or may be omitted. That is, only filter elements 241-1~241-P are used, so that it can be considered that Y=1. Assuming as was done above with respect to device 100 that the input data samples are to be subjected to X=160 filtering operations each employing M=4 filtering coefficients to realize a 640 tap filter, this means that device 200 needs to loop X/Y=160 sets of filter coefficients through each filter element 241-1~241-P during each time interval j before it can shift a new group of polyphased data samples IN(n)(1)~IN(n)(P) into delay lines 230-1~230-P. In other words, each time interval q can be considered to be divided into Z=160 subintervals s, wherein each filter element 241-*j* for each polyphase j is updated with a new set of filter coefficients from second source 220 during each subinterval s.

Now again, consider a case where second source 220 comprises a memory device, as will be the case in many embodiments.

Compared to device 100, this reduces the number of bits of filter coefficients that are output by the memory device for second source 220 for each subinterval or clock cycle s. In particular, to execute the filtering operations at the full clock rate requires that device 200 be able to read C/160=10240 bits (or M*Y*P*N=10240 bits) of filter coefficients from the memory device for second source 220 for each subinterval or clock cycle s. Furthermore, this means that the memory device for second source 220 needs to be at least 10240 bits wide, and at least 160 bits deep. Thus it is seen that the memory device for second source 220 of device 200 can be narrower and deeper than the memory device for second source 120 of device 100.

However, device 200 needs to loop the subinterval index s from 0 to 159 within each time interval q, instead of from looping s only from 0 to 19 as in device 100. Hence, for the same subinterval period or clock rate s, the throughput of device 200 is reduced by a factor of eight (8) compared to device 100.

It would be desirable to provide a device and method of operation that can operate with the narrower memory width of second source 220 of device 200 compared to device 100, while at the same time not suffering from the throughput penalty of device 200.

Figure 3:
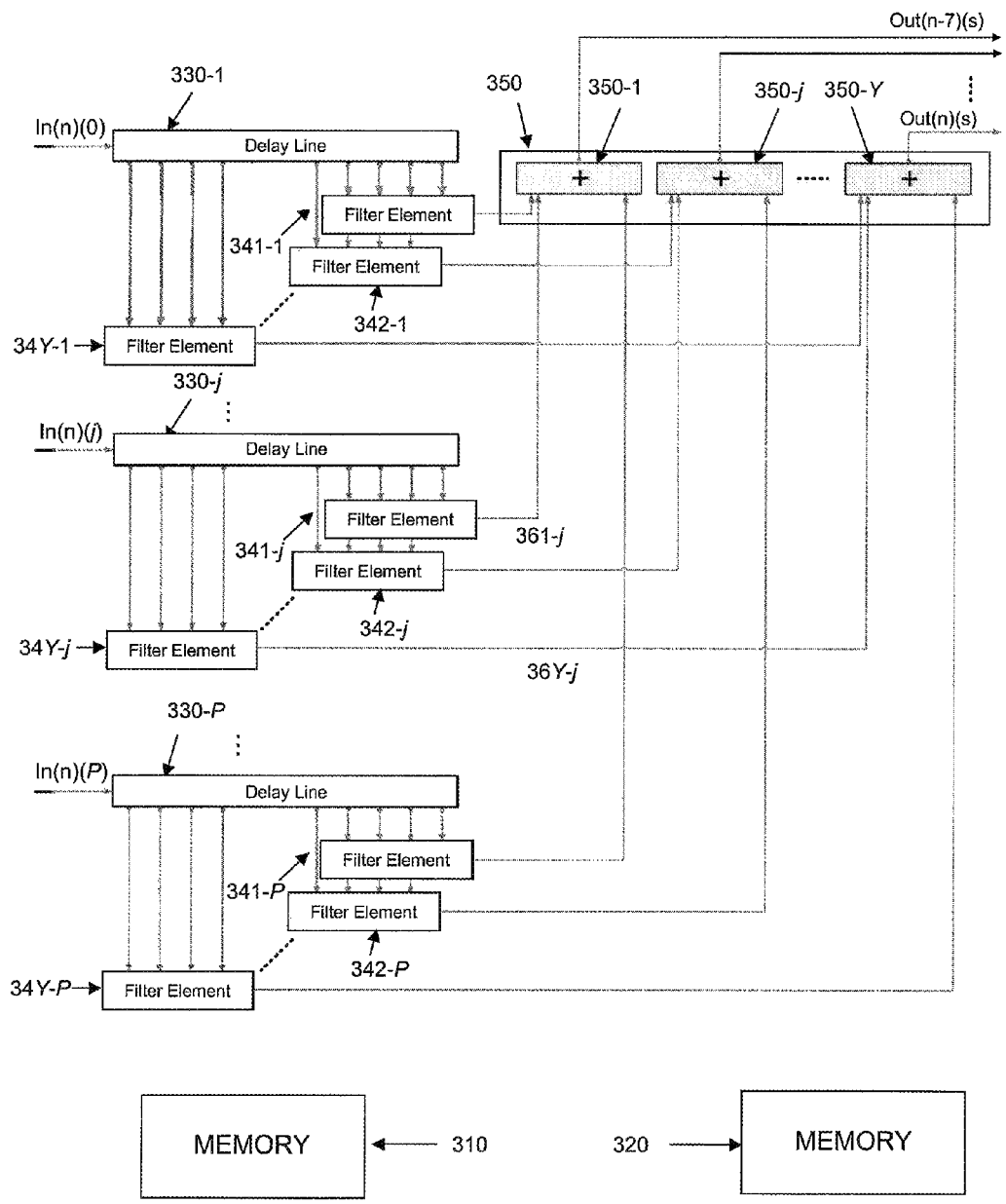
FIG. 3 illustrates yet another embodiment of a device for filtering polyphased data.

FIG. 3 illustrates yet another embodiment of a device 300 for filtering polyphased data samples.

Device 300 includes a first source 310; a second source 320; a plurality of delay lines 330-1~330-P; a plurality of groups of filter elements 341-1~341-P through 34Y-1~34Y-P; and a combiner 350 including a plurality of combining elements 350-1~350-P, where in the illustrated example Y=8 and P=160. Each of the delay lines 330-1~330-P stores a set of L=(Y+M−1)=(8+4−1)=11 polyphased input data samples {IN(n−10)(j)~IN(n)(j)} at any given time. Each of the filter elements 341-$j$~34Y-$j$ operates on a different subset of 4 (four) of the L=11 polyphased input data samples stored in the corresponding delay line 330-$j$ with a set of M=4 filter coefficients. In some embodiments, each of the filter elements 341-1~341-P through 34X-1~34Y-P comprises a multiply-accumulate (MAC) unit.

In one embodiment, first source 310 comprises a memory device. In alternative embodiments, input data samples may be supplied from any other source which includes an appropriate mechanism (e.g., through handshaking) to control or throttle the data output rate.

In one embodiment, second source 320 comprises a memory device. In alternative embodiments, coefficients may be supplied from any other source which includes an appropriate mechanism (e.g., through handshaking) to control or throttle the coefficient output rate.

In device 300, all of the filter elements 341-$j$~34Y-$j$ for each corresponding delay line 330-$j$ employ the same set of four (4) filter coefficients during a given subinterval or clock cycle s.

One exemplary operation of device 300 will now be described.

In one embodiment, polyphased input data samples are supplied from first source 310 to delay lines 330-1~330-P, with Y=8 new polyphased input data samples IN(n−7)(j)~IN(n)(j) from each polyphase j being supplied to a corresponding one of the delay lines 330-1~330-P during each time interval q. That is, during each time interval q first source 310 provides eight (8) groups of polyphased input data samples to delay lines 330-1~330-P of device 300.

Also, sets of filter coefficients are supplied from second source 320 to each of the filter elements 341-1~34Y-1 through 341-P~34Y-P. Because each of the Y=8 physical filter elements 341-$j$~34Y-$j$ available in device 300 for each polyphase j applies the same set of filter coefficients for each polyphase j, and in the given example device 300 needs to apply X=160 filtering operations to each set of polyphased input data samples, device 300 needs to loop X=160 sets of filter coefficients through each of the filter elements 341-1~34Y-1 through 341-P~34Y-P during a time interval q before it can shift eight (8) new input data samples into each of the delay lines 330-1~330-P. Each time interval q can be considered to be divided into Z=160 subintervals s, wherein each of the Y filter elements 341-$j$~34Y-$j$ for each polyphase j is updated with a new set of filter coefficients from second source 320 during each subinterval or clock cycle s.

During each subinterval s, the set of polyphased input data in each corresponding delay line 330-$j$ is filtered with the corresponding group of filter elements 341-$j$~34Y-$j$ to produce output data samples 361-$j$~36Y-$j$. The output data samples 361-$j$~36Y-$j$ from each of the filter elements 341-$j$~34Y-$j$ for polyphase j are combined with corresponding output data samples from all of the other polyphases to produce filtered data Out[n−7][s]~Out[n][s], where s is an index for the subintervals (0~160), and can be considered to be an index for decimation when device 300 performs filtering and decimation. In particular, the output samples 361-1~36Y-1 from filter elements 341-1~34Y-1 are combined together by combining element 350-1 to produce filtered data signal Out[n−7][s], the output samples 361-2~36Y-2 from filter elements 341-2~34Y-2 are combined together by combining element 350-2 to produce filtered data signal Out[n−6][s], etc.

If we consider an example where Y=8, at the eight (8) outputs of device 300, as a function of time, the filtered data is:

| TIME | 1$^{st}$ Output | 2$^{nd}$ Output | 3$^{rd}$ Output | | 8$^{th}$ Output |
|---|---|---|---|---|---|
| Subinterval0 | Out[n][0] | Out[n − 1][0] | Out[n − 2][0] | ... | Out[n − 7][0] |
| Subinterval1 | Out[n][1] | Out[n − 1][1] | Out[n − 2][1] | ... | Out[n − 7][1] |
| ... | | | | | |
| Subinterval159 | Out[n][159] | Out[n − 1][159] | Out[n − 2][159] | ... | Out[n − 7][159] |
| ... | | | | | |

It is apparent that the filtered data comes out of the combiner 360 of device in a different order than the filtered data come out of device 100. Accordingly, some extra hardware components may be employed to reorder the filtered data to produce a set of reordered filtered data that has an order that corresponds to an order of the input data samples. However such a reordering operation is very straightforward.

However, beneficially device 300 can employ a memory device for second source 320 that is less wide than the memory device for second source 120 in device 100, while still providing the same throughput rate as device 100.

Because each of the Y=8 filter elements for each polyphase j receives the same set of filter coefficients, a memory device employed for second source 320 can be less wide than a memory device employed for second source 120 in device 100. To execute the filtering operations at the full clock rate requires that device 300 be able to read C/160=10240 bits (or M*P*N=10240 bits) of filter coefficients from second source 320 for each subinterval or clock cycle s. In particular, for the example operation of device 300 described above, a processor (not shown in FIG. 3) may control operations and timing of the circuitry in FIG. 3, including supplying a loop of X=160 addresses to a memory device for second source 320 over X=160 subintervals s in order to cause second source 320 to output a series of 160 clusters of filters coefficients, each cluster comprising 10240 bits (i.e., one set of M=4 16-bit filter elements for each of 160 polyphases).

Furthermore, since in device 300, in one time interval q eight new groups of polyphased input data samples are shifted into device 300, device 300 can provide the same throughput rate as device 100. That is, by having delay lines 330-1~330-P be (Y–1)=7 data samples longer than the corresponding delay lines in device 100, and by having each of the eight (8) filter elements for each polyphase j work on different subsets of the set of polyphased input data stored in the delay lines 330-j at the same time the throughput of device 300 can be maintained the same as for device 100.

In an alternative operating mode, during the time interval q for looping the filter coefficient sets over the sets of input data samples we each time shift in 1 new sample on one of the polyphases and then new polyphased (i.e., 160 parallel) ones (so, 160 times 1 phase and then 7 times 160 phases).

In some embodiments, device 300 may execute a decimation/downsampling algorithm in conjunction with its filtering function. In that case, each of the filtered data signals may represent a filtered and decimated/downsampled by P version of the polyphased input data in which case for P polyphases in, there is only one data sample out, hence the decimation. When X=P, there is no decimation and the output represents a time variant filter of the input signal with period P=X. In a more general case, device 100 may decimate by some number H, in which case X=P/H.

In some embodiments, device 300 may be employed to create periodic time variant filters with or without decimation.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A device for filtering polyphased input data having a plurality of polyphases, the device comprising:
a plurality of delay lines corresponding to the plurality of polyphases, where a delay line is configured to receive a set of the input data samples from the corresponding polyphase;
a plurality of groups of filter elements corresponding to the plurality of delay lines and the plurality of polyphases, wherein,
the filter elements with any one of the groups are configured to operate in parallel with each other on corresponding different subsets of the set of the input data samples for the corresponding delay line,
the filter elements within said any one of the groups are configured to sequentially perform a plurality of filtering operations on the corresponding subsets of the set of the input data samples using a plurality of sets of filter coefficients which are sequentially received, each filter element providing an output data sample for each filtering operation, and
the filter elements within said any one of the groups are configured to employ a same set of filter coefficients as each other at a same time during the filtering operations; and
a combiner for combining the output data samples from the groups of filter elements to produce filtered data,
wherein the delay lines have lengths greater than a number of the input data samples in any one of the subsets.

2. The device of claim 1, wherein the number of filter elements in said any one of the groups of filter elements is Y>1, the number of filter coefficients employed by one filter element is M, and the length of the delay line is (Y+M−1) input data samples long.

3. The device of claim 2, wherein the combiner combines the output data samples for each filter element in said any one of the groups with corresponding output data samples from corresponding filter elements for all of the other polyphases to produce the filtered data.

4. The device of claim 3, further comprising:
a first source configured to provide the input data samples for the plurality of polyphases to the plurality of delay lines; and
a second source configured to provide the sets of filter coefficients.

5. The device of claim 4, wherein the first source provides Y new input data samples to each delay line during a defined time interval, and wherein the second source sequentially provides Z sets of filter coefficients to each filter element during each time interval.

6. The device of claim 5, wherein the second source comprises a memory device having a width that is at least equal to: a number of bits in one of the filter coefficients, multiplied by the number of polyphases, and further multiplied by the number of filter coefficients in one of the sets of filter coefficients; and having a memory depth that is at least equal to Z.

7. The device of claim 1, wherein each filter element comprises a multiply-accumulate (MAC) unit.

8. The device of claim 1, wherein the device decimates the polyphased input data while it filters the polyphased input data.

9. A method of filtering polyphased input data having a plurality of polyphases, comprising:
providing a processor, the processor configured to effect the method, the method comprising:
providing a plurality of delay lines corresponding to the plurality of polyphases, the delay lines being configured to store a set of input data samples; and
for any one of the delay lines:
providing a corresponding group of filter elements, the filter elements being configured to operate at a particular time on corresponding different subsets of the set of the input data samples stored in the corresponding delay line,
during a given time interval shifting into the delay line a plurality of new input data samples corresponding to a number of filter elements in the group of filter elements,
during a plurality of subintervals within the time interval, sequentially supplying a group of filter coefficients to the group of filter elements, each of the filter elements receiving in each subinterval a same set of filter coefficients as other filter elements within the group, and
outputting from each filter element an output data sample; and combining corresponding output data samples from corresponding filter elements for the plurality of delay lines to produce filtered data.

10. The method of claim 9, wherein the number of filter elements in the group of filter elements is Y>1, the number of filter coefficients employed by one filter element is M, and the length of each delay line is (Y+M−1) input data samples long.

11. The method of claim 9, wherein the plurality of subintervals is Z, and wherein the filter coefficients are stored in a memory device having a width that is at least equal to: a number of bits in one of the filter coefficients, multiplied by the number of polyphases, and further multiplied by the number of filter coefficients in one of the sets of filter coefficients; and having a memory depth that is at least equal to Z.

12. The method of claim 9, further comprising performing a decimation operation during the filtering.

13. The method of claim 9, further comprising reordering the filtered data to produce a set of reordered filtered data having an order that corresponds to an order of the input data samples.

14. A method of filtering polyphased input data having a plurality (P) of polyphases, comprising:
 providing a processor, the processor configured to effect the method, the method comprising:
 providing P delay lines corresponding to the P polyphases, the delay lines being L=(Y+M−1) input data samples long; and
 for a polyphase:
  providing Y identical filter elements, wherein a filter element operates with M filter coefficients; and
  during a time interval:
   shifting a set of Y new input data samples for the polyphase into the corresponding delay line such that the corresponding delay line has L input data samples, and
   for a subinterval among a plurality (Z) of subintervals within the time interval,
    updating the Y identical filter elements with a new set of filter coefficients from among a plurality (Z) of sets of filter coefficients,
    filtering Y different subsets of the L input data samples in the corresponding delay line with the Y filter elements having identical filter coefficients to produce Y output data samples, and
    combining the Y output data samples for the polyphase with corresponding output data samples from all of the other polyphases to produce filtered data.

15. The method of claim 14, wherein the filter coefficients are stored in a memory device having, a memory width that is at least equal to a number of bits (N) in each filter coefficient, multiplied by the number of polyphases (P), and further multiplied by the number of filter coefficients (M), and having a memory depth that is at least equal to Z.

16. The method of claim 15, wherein each subset of the input data samples includes M input data samples.

* * * * *